United States Patent
Aritome

(10) Patent No.: US 7,924,619 B2
(45) Date of Patent: *Apr. 12, 2011

(54) PROGRAMMING METHOD TO REDUCE WORD LINE TO WORD LINE BREAKDOWN FOR NAND FLASH

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/502,537

(22) Filed: Jul. 14, 2009

(65) Prior Publication Data

US 2009/0273979 A1 Nov. 5, 2009

Related U.S. Application Data

(63) Continuation of application No. 11/390,747, filed on Mar. 28, 2006, now Pat. No. 7,561,469.

(51) Int. Cl.
*G11C 16/10* (2006.01)
*G11C 16/06* (2006.01)
*G11C 16/12* (2006.01)
*G11C 7/02* (2006.01)
*G11C 8/08* (2006.01)

(52) U.S. Cl. ......... 365/185.18; 365/185.02; 365/185.17; 365/185.23; 365/185.25; 365/185.24

(58) Field of Classification Search ............. 365/185.02, 365/185.17, 185.18, 185.23, 185.25, 206, 365/185.24

See application file for complete search history.

(56) References Cited

U.S. PATENT DOCUMENTS

| | | |
|---|---|---|
| 5,257,225 A | 10/1993 | Lee |
| 5,357,463 A | 10/1994 | Kinney |
| 5,424,993 A | 6/1995 | Lee et al. |
| 5,511,022 A | 4/1996 | Yim et al. |
| 5,528,547 A | 6/1996 | Aritome et al. |
| 5,621,684 A | 4/1997 | Jung |
| 5,677,873 A | 10/1997 | Choi et al. |
| 5,677,875 A | 10/1997 | Yamagata et al. |
| 5,680,350 A | 10/1997 | Lee |
| 5,715,194 A | 2/1998 | Hu |
| 5,768,287 A | 6/1998 | Norman et al. |
| 5,771,346 A | 6/1998 | Norman et al. |

(Continued)

OTHER PUBLICATIONS

S. Satoh et al., A Novel Gate-Offset NAND Cell (GOC-NAND) Technology Suitable for High-Density and Low-Voltage-Operation Flash Memories, Microelectronics Engineering Laboratory, Japan, IEEE, 1999, 4 pgs.

(Continued)

*Primary Examiner* — J. H. Hur
(74) *Attorney, Agent, or Firm* — Leffert Jay & Polglaze, P.A.

(57) ABSTRACT

A NAND architecture non-volatile memory device and programming process programs the various cells of strings of non-volatile memory cells by the application of differing word line pass voltages (Vpass) to the unselected word lines adjacent to the selected word line and memory cell being programmed in order to reduce voltage differences between the word lines of the memory cell string or array during a programming cycle. This allows the word line to word line voltage differential to be reduced and thus decreases the likelihood of breakdown or punch through of the insulator materials placed between the adjacent word lines.

22 Claims, 6 Drawing Sheets

U.S. PATENT DOCUMENTS

| | | | |
|---|---|---|---|
| 5,907,855 A | 5/1999 | Norman |
| 5,917,757 A | 6/1999 | Lee et al. |
| 5,920,501 A | 7/1999 | Norman |
| 5,930,168 A | 7/1999 | Roohparvar |
| 5,959,892 A | 9/1999 | Lin et al. |
| 5,991,202 A | 11/1999 | Derhacobian et al. |
| 6,061,270 A | 5/2000 | Choi |
| 6,107,658 A | 8/2000 | Itoh et al. |
| 6,157,575 A | 12/2000 | Choi |
| 6,163,048 A | 12/2000 | Hirose et al. |
| 6,240,016 B1 | 5/2001 | Haddad et al. |
| 6,240,023 B1 | 5/2001 | Roohparvar |
| 6,370,062 B2 | 4/2002 | Choi |
| 6,380,033 B1 | 4/2002 | He et al. |
| 6,469,933 B2 | 10/2002 | Choi et al. |
| 6,487,117 B1 | 11/2002 | Choi et al. |
| 6,493,270 B2 | 12/2002 | Chevallier |
| 6,498,752 B1 | 12/2002 | Hsu et al. |
| 6,519,181 B2 | 2/2003 | Jeong |
| 6,522,584 B1 | 2/2003 | Chen et al. |
| 6,620,682 B1 | 9/2003 | Lee et al. |
| 6,657,915 B2 | 12/2003 | Seo et al. |
| 6,660,585 B1 | 12/2003 | Lee et al. |
| 6,661,707 B2 | 12/2003 | Choi et al. |
| 6,707,714 B2 | 3/2004 | Kawamura |
| 6,798,694 B2 | 9/2004 | Mihnea et al. |
| 6,925,011 B2 | 8/2005 | Pekny et al. |
| 6,975,542 B2 | 12/2005 | Roohparvar |
| 6,977,842 B2 | 12/2005 | Nazarian |
| 6,982,905 B2 | 1/2006 | Nguyen |
| 7,020,017 B2 | 3/2006 | Chen et al. |
| 7,099,193 B2 | 8/2006 | Futatsuyama |
| 7,120,059 B2 | 10/2006 | Yeh |
| 7,161,833 B2 | 1/2007 | Hemink |
| 7,212,435 B2 | 5/2007 | Rudeck et |
| 7,245,534 B2 | 7/2007 | Goda et al. |
| 7,292,476 B2 | 11/2007 | Goda et al. |
| 7,355,889 B2 | 4/2008 | Hemink et al. |
| 7,394,693 B2 | 7/2008 | Aritome |
| 7,408,810 B2 | 8/2008 | Aritome et al. |
| 7,440,321 B2 | 10/2008 | Aritome |
| 7,471,565 B2 | 12/2008 | Aritome |
| 7,499,330 B2 | 3/2009 | Goda et al. |
| 2002/0060926 A1 | 5/2002 | Choi et al. |
| 2002/0075727 A1 | 6/2002 | Jeong et al. |
| 2002/0149958 A1 | 10/2002 | Kunikiyo |
| 2004/0080980 A1 | 4/2004 | Lee |
| 2004/0152262 A1 | 8/2004 | Ichige et al. |
| 2004/0237000 A1 | 11/2004 | Keays |
| 2005/0088890 A1 | 4/2005 | Matsunaga et al. |
| 2005/0226055 A1 | 10/2005 | Guterman |
| 2005/0265097 A1 | 12/2005 | Tanaka et al. |
| 2006/0002167 A1 | 1/2006 | Rudeck et al. |
| 2006/0023502 A1 | 2/2006 | Cernea et al. |
| 2006/0274583 A1 | 12/2006 | Lutze |
| 2007/0047314 A1 | 3/2007 | Goda et al. |
| 2007/0171718 A1 * | 7/2007 | Hemink et al. ......... 365/185.14 |
| 2007/0177429 A1 | 8/2007 | Nagashima et al. |
| 2007/0236992 A1 | 10/2007 | Oowada |
| 2007/0258286 A1 | 11/2007 | Higashitani |
| 2008/0101126 A1 | 5/2008 | Hemink et al. |
| 2008/0253187 A1 | 10/2008 | Aritome |
| 2008/0316827 A1 | 12/2008 | Higashitani |
| 2009/0018211 A1 | 1/2009 | Nair et al. |

OTHER PUBLICATIONS

Satoh et al., A Novel Isolation-Scaling Technology for NAND EEPROMs with the Minimized Program Disturbance, Microelectronics Engineering Laboratory, Japan, IEEE, 1997, IEDM 97-291, pp. 11.6.1-11.6.4.

Jung et al., "A 117-mm2 3.3-V Only 128-Mb Multilevel NAND Flash Memory for Mass Storage Applications" IEEE Journal of Solid-State Circuits, IEEE Inc., New York, NY, U.S., vol. 31, No. 11, Nov. 1996, pp. 1575-1583.

K. Suh et al., "A 3.3 V 32 Mb NAND Flash Memory with Incremental Step Pulse Programming Scheme" IEEE Journal of Solid-State Circuits, IEEE Inc., New York, NY, vol. 30, No. 11, Nov. 1995, pp. 1149-1156.

* cited by examiner

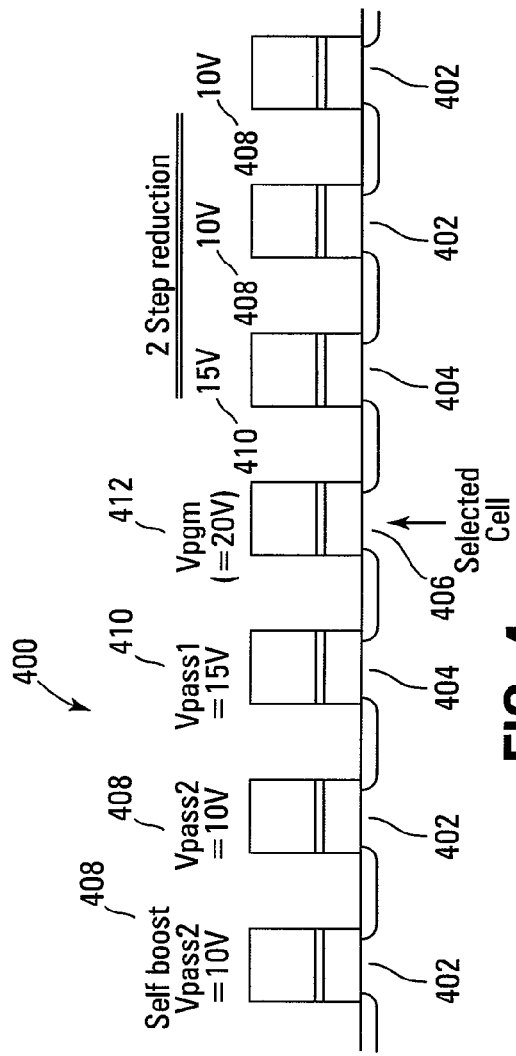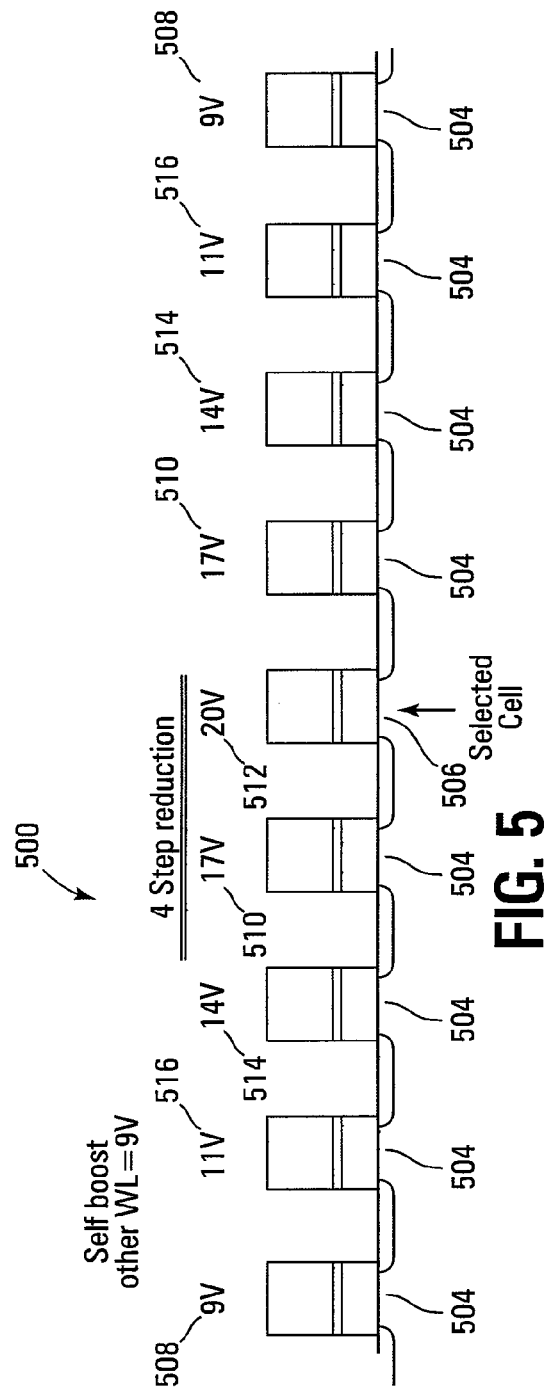

PROGRAMMING METHOD TO REDUCE WORD LINE TO WORD LINE BREAKDOWN FOR NAND FLASH

RELATED APPLICATIONS

This is a continuation of U.S. application Ser. No. 11/390,747, titled "PROGRAMMING METHOD TO REDUCE WORD LINE TO WORD LINE BREAKDOWN FOR NAND FLASH", filed Mar. 28, 2006 (allowed) now U.S. Pat. No. 7,561,469, which is commonly assigned and the entire contents of which are incorporated herein by reference.

TECHNICAL FIELD OF THE INVENTION

The present invention relates generally to memory devices and in particular the present invention relates to EEPROM and Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Unlike RAM, ROM cannot be written to. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the memory cells in the form of charge on the floating gates. A typical floating gate memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide. For example, a tunnel oxide that is formed between the floating gate/node and the channel region. A control gate is located over the floating gate/node and is typically made of doped polysilicon or metal. The control gate is electrically separated from the floating gate/node by another dielectric layer. Thus, the floating gate or charge trapping layer/floating node is "floating" in dielectric so that it is insulated from both the channel and the control gate. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of memory cells. Each of the memory cells includes a floating gate or charge trapping layer embedded in a field effect transistor (FET) transistor. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent Flash memory devices multiple bits have been stored in a single cell by utilizing multiple threshold levels or a non-conductive charge trapping layer with the storing of data trapped in a charge near each of the sources/drains of the memory cell FET.

An EEPROM or Flash NAND array architecture arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity. It is noted that other non-volatile memory array architectures exist, including, but not limited to AND arrays, OR arrays, and virtual ground arrays.

A problem in modern NAND architecture Flash memory devices is that, as device sizes and features are further reduced with improved processing, the separation between adjacent word lines in the array is reduced (also known as an increased word line or memory cell "array pitch"). This reduced word line separation can allow for punch-through or breakdown of the insulator between adjacent word lines when they have elevated voltages applied to them and high voltage differentials exist between adjacent word lines, such as during programming operations.

For the reasons stated above, and for other reasons stated below which will become apparent to those skilled in the art upon reading and understanding the present specification, there is a need in the art for alternative methods of programming and accessing NAND architecture Flash memory arrays.

BRIEF DESCRIPTION OF THE DRAWINGS

FIGS. 4-6 show diagrams detailing program word line voltages, showing Vpgm and Vpass selection, in accordance with embodiments of the present invention.

DETAILED DESCRIPTION

Figure 1:
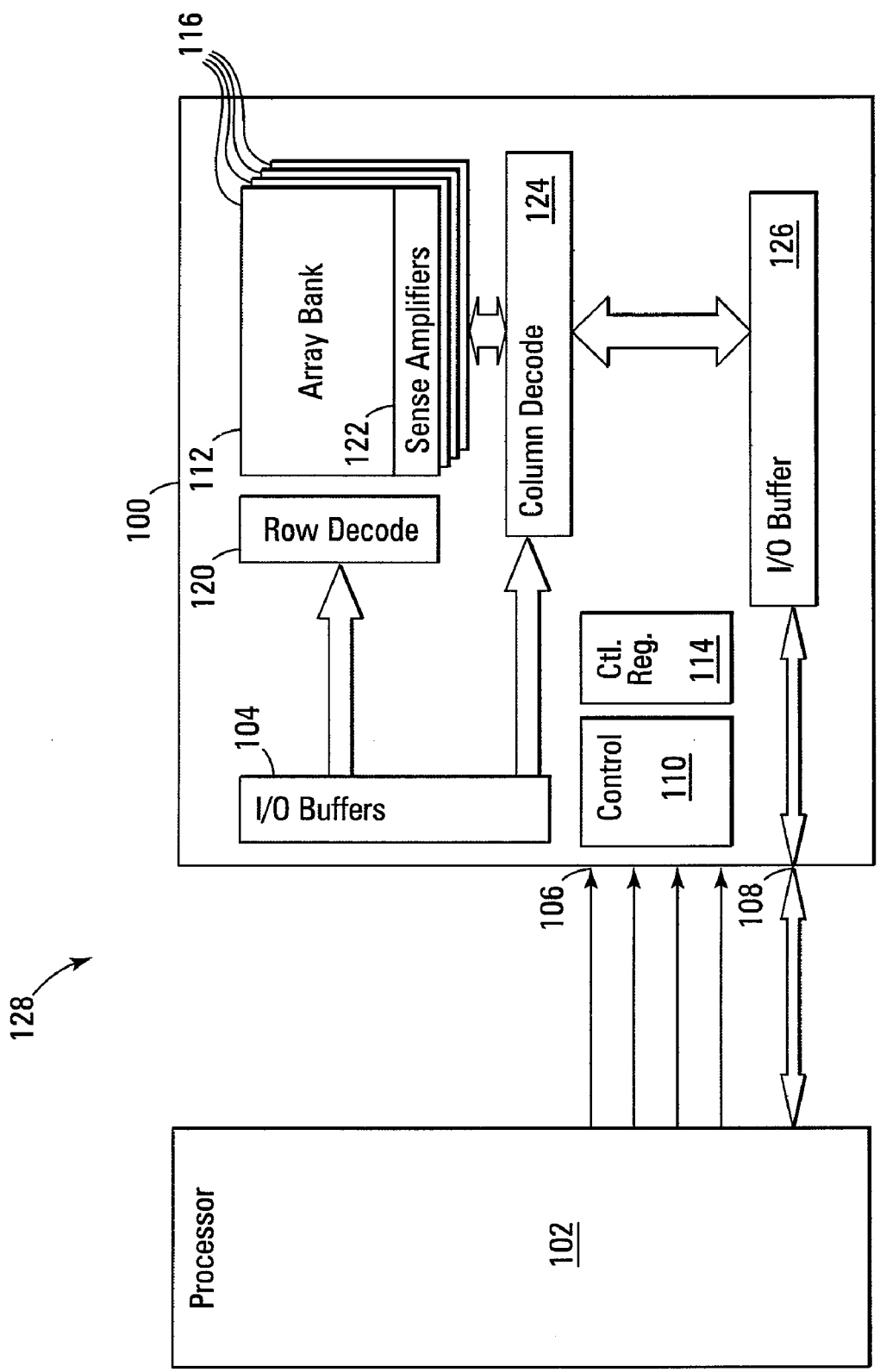
FIG. 1 is a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include memory devices and arrays which utilize closely spaced word line architectures, such as NAND architecture non-volatile memory devices, that use stepped voltages in adjacent word lines to reduce word line to word line voltage differentials in array operations. In NAND architecture non-volatile memory device embodiments, the various cells of strings of non-volatile memory cells are accessed by the application of differing word line pass voltages (Vpass) to the unselected word lines adjacent to the selected word line and memory cell in order to reduce voltage differences between the word lines of the memory cell string or array during a high voltage operation, such as a programming or erase cycle. This allows the word line to word line voltage differential to be reduced and thus decreases the likelihood of breakdown or punch through of the insulator materials placed between the adjacent word lines. In one embodiment of the present invention, the differing word line pass voltages (Vpass) are utilized depending on the placement of the memory cell being programmed or erased in the NAND memory cell string and the relative positions of the unselected adjacent word lines. In another embodiment, the word lines coupled to the control gates of non-volatile memory cells of a given NAND memory string will have different voltages placed on them dependent on their position in the memory string and the programming method being utilized. In another embodiment, in addition to utilizing the relative position of the unselected adjacent word lines, the different word line pass voltages (Vpass) are also applied to the string based on physical aspects of the word lines of the array, including, but not limited to, an interlaced array of alternating wide/thin cross section word lines which have higher/lower word line resistances and/or insulating oxide thickness between adjacent word lines or with the underlying non-volatile memory cells. It is noted that embodiments of the present invention include all non-volatile memory cell devices and memories that trap charge in an electrically isolated region (such as charge trapping/floating node memory cells) and are not limited to floating gate memory cell arrays or memory devices.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access the row address is latched by the interface I/O buffer 104 and decoded by row decode circuit 120, which selects and activates a row page (not shown) of memory cells and the other memory cells in their associated strings across a selected memory bank. The bit values encoded in the output of the selected row of memory cells are connected from a local bitline/string (not shown) to a global bitline (not shown) and detected by sense amplifiers 122 associated with the memory bank. The sense amplifiers 122 also typically include a data cache and write data latch circuits (not shown). The column address of the access is also latched by the interface I/O buffer 104 and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

As stated above, two common types of non-volatile or Flash memory array architectures are the "NAND" and "NOR" architectures, so called for the resemblance which the basic memory cell configuration of each architecture has to a basic NAND or NOR gate circuit, respectively. In the NAND array architecture, the memory cells of the memory array are arranged in a matrix similar to conventional RAM or ROM, such that the gates of each memory cell of the array are coupled by rows to word lines (WL). However each memory cell is not directly coupled to a source line (SL) and a column bit line (BL), as would be the case in the NOR architecture style. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

Figure 2:
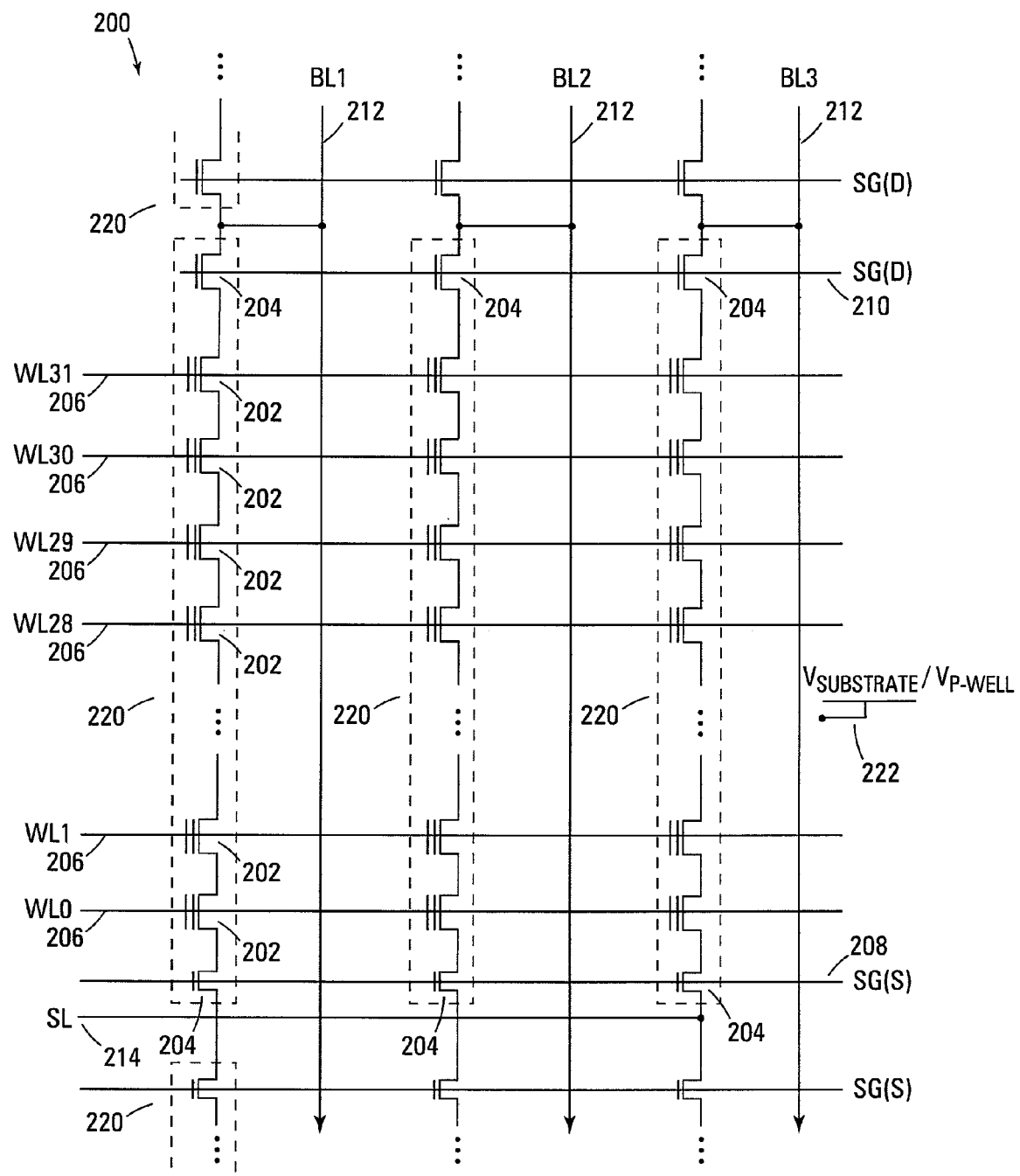
FIG. 2 is a simplified block diagram of a NAND architecture Flash memory array in accordance with an embodiment of the present invention.

FIG. 2 shows a schematic of a simplified NAND architecture floating node or trapping layer memory array 200 of a NAND Flash memory device of an embodiment of the present invention. It is noted that the memory array 200 of FIG. 2 is for illustrative purposes and should not be taken as limiting and that other NAND memory array embodiments of the present invention are possible and will be apparent to those skilled in the art with the benefit of the present disclosure. In FIG. 2, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, one or more NAND architecture memory strings 220 of the memory are shown formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and then programming or inhibiting the selected memory cells to either programmed threshold level (typically to set at logical "0" by the injection of charge to the floating gate or floating node of a memory cell) or inhibited level (the cell is not programmed and left in its original state, usually intended to leave the cell erased and set at logical "1") by coupling the channels of the memory cells to either a program or inhibit voltage. It is noted that some erase operations also include program cycles. These erasure program cycles are typically used to preprogram the cells to a uniform programmed threshold voltage before erasure and to "heal" over-erased memory cells to a uniform erased state threshold voltage afterwards.

Figure 3:
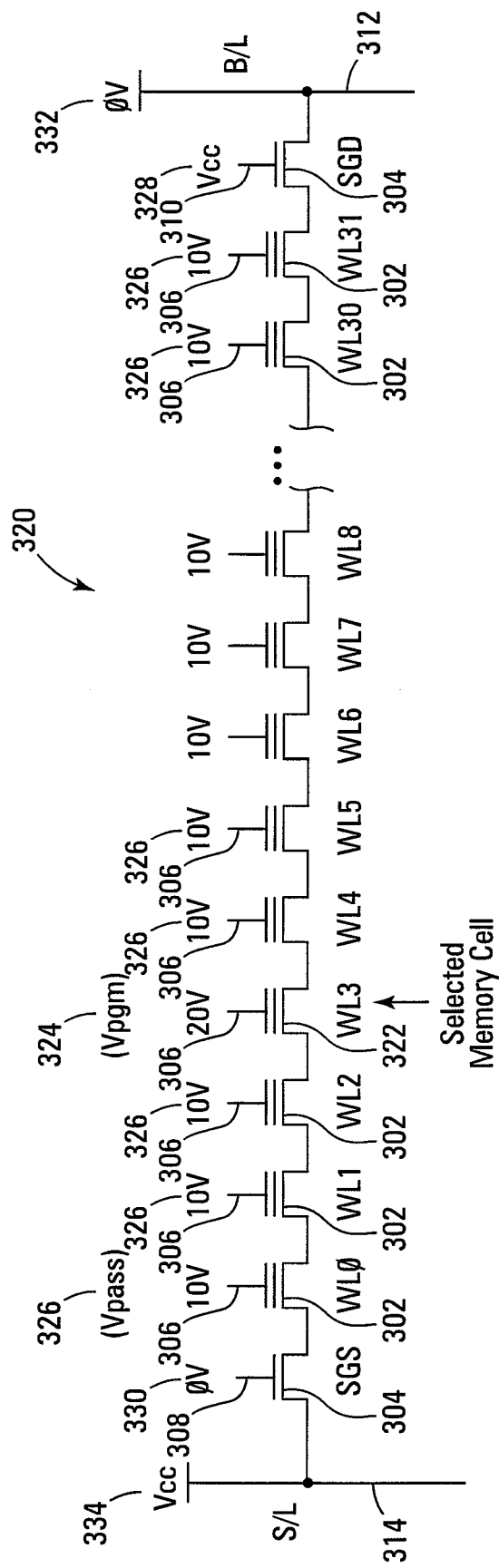
FIG. 3 shows a diagram detailing a typical program word line voltages, showing Vpgm and Vpass selection.

As detailed in FIG. 3, in programming operations in NAND architecture Flash/EEPROM memory arrays, a programming voltage 324 is coupled to a word line 306 coupled to the gate of the selected memory cell 322 of a memory string 320. In addition, the word lines 306 that are coupled to the gates of the unselected memory cells 302 of the string 320 are also driven by a pass voltage (Vpass) 326 so as to operate them as pass transistors, generating a channel of carriers by capacitive coupling in the unselected memory cells 302 and allowing them to pass current in a manner that is relatively unrestricted by their stored data values. The memory string 320 is then coupled to a bit line 312 or source line 314 that has a program voltage placed upon it, through the generated channel of the string 320 and one or both of the select gates 304. This applies a field that across the selected memory cell 322 that causes carriers to tunnel from the channel to the floating gate or charge trapping layer, altering the threshold voltage level (Vt) of the selected memory cell 322 and storing the data value. If a program-inhibit voltage placed upon the coupled bit line 312 or source line 314, the applied field is not sufficient to tunnel carriers to the floating gate/node, no data value is programmed and the selected memory cell 322 remains in the erased state.

In the example programming operation detailed in FIG. 3, a program voltage (Vpgrm=20V) 324 is placed on the word line 306 coupled to the control gate of the selected memory cell 322. A channel is generated in the string 320, by the application of a pass voltage (Vpass=10V) 326 to the word lines 306 coupled to the control gates of the unselected memory cells 302 of the string 320. The select gate 304 coupling the memory string 320 to the source line 314 is turned off to isolate the string 320 from the source line 314 by the application of 0V 330 to the source select gate control line 308 and Vcc 334 to the source line 314. The memory string 320 is coupled to the bit line 312 through the drain select gate 304 by the application of Vcc 328 to the select gate drain control line 310 and the selected memory cell 322 is then programmed to a logical "0" state by the application of 0V 332 to the bit line 312. It is noted that the programming operation of FIG. 3 is for illustrative purposes and should not be taken as limiting.

After programming the selected memory cell(s) 322, a verify operation is then performed to confirm that the data was successfully programmed. If the programmed memory cell(s) 322 fail verification, the program and verify cycle is repeated until the data is successfully programmed or a selected number of iterations have passed and the programming operation is deemed to have failed.

As stated above, problem in modern Flash/EEPROM memory devices is that, as device sizes and features are further reduced with improved processing, the separation between adjacent word lines in the array is reduced (also known as having an increased word line or memory cell "array pitch") to help increase memory density and reduce array size. This reduced separation between word lines can inadvertently cause issues, such as insulation break down or punch through between adjacent word lines, when the array is subject to high voltages. This is particularly an issue with high density NAND architecture Flash memory devices that typically do not have as many intervening bit lines, source lines, control lines or other devices in the middle of each memory string to increase this separation. This reduced word line separation in NAND architecture non-volatile memory device can allow for punch-through, breakdown or other failures of the insulator between adjacent word lines when they have elevated voltages applied to them and high voltage differentials exist between adjacent word lines, such as during programming or erase operations. This can allow for data disturb or corruption, physical damage to the array or memory cells, static shorting or opens of adjacent word lines, dynamic shorting or open faults, or issues caused by the excessive capacitive coupling induced through the large voltage differential.

Embodiments of the present invention apply stepped word line voltages to arrays to reduce the voltage differential between selected and unselected adjacent word lines during high voltage operations, such as programming and erasure in non-volatile memory devices. This facilitates an increase in memory device endurance and lifetimes due to a decrease in memory word line to word line stress, and cell stress. In particular, embodiments of the present invention are specifically suited to memory devices and arrays which utilize closely spaced word line architectures, such as NAND architecture non-volatile memory devices. In one NAND architecture non-volatile memory device embodiment of the present invention, the various cells of non-volatile memory cell strings are programmed by the application of differing word line pass voltages (Vpass) in a stepped pattern to the unselected word lines adjacent to the selected word line and memory cell being programmed in order to reduce voltage differences between the word lines of the memory cell string during a programming cycle. This allows the word line to word line differential voltages to be reduced and thus decrease the likelihood of breakdown or punch through of the insulator materials placed between the adjacent word lines.

Figure 6:
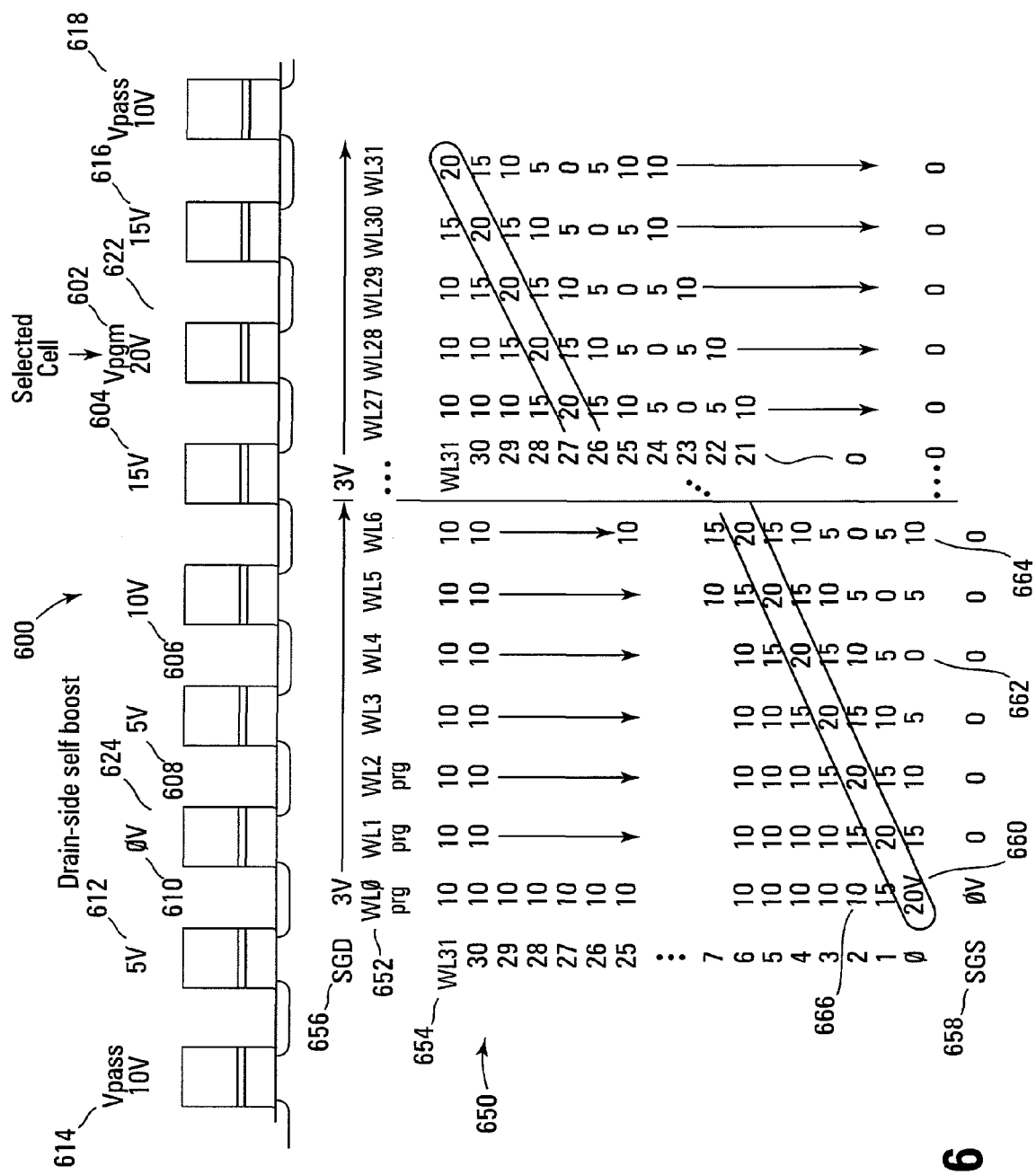

FIGS. 4-6 illustrate a typical NAND architecture memory array and string programming operations of one embodiment of the present invention utilizing stepped Vpass word line voltages utilized to reduce word line to word line voltage differentials. It is noted that the NAND programming operations described in FIGS. 4-6 are for illustrative purposes and should not be taken as limiting.

FIG. 4 illustrates an example of Vpass selection in adjacent word lines 404 during a self boost programming operation in one NAND architecture memory embodiment of the present invention. A simplified side view of the center of a NAND architecture memory cell string 400 is shown in FIG. 4, detailing the gate stacks of the memory cells 402, 404, 406, the memory cell selected for programming 406, the unselected memory cells 402, 404, and the respective Vpgm 412 and Vpass 408, 410 voltages applied to each. The applied Vpass 408, 410 for the memory cell string 400 is selected in two steps, so that the word lines directly adjacent 404 to the selected word line/memory cell 406 have a Vpass voltage (e.g., 15V) 410 that is between that of the standard Vpass (e.g., 10V) 408 applied to the other unselected word lines/memory cells 402 of the string 400. In one embodiment this Vpass step for the adjacent word lines 404 is selected at one half the difference between the Vpgm voltage 412 and the standard Vpass voltage 408. It is noted that for evenly spaced word lines, selecting the word line pass voltage that is one half the difference between Vpgm and standard Vpass will result in the smallest field across the insulation between the word lines of the string. The stepped increases in Vpass in the adjacent word lines 404, reduces the maximum voltage differential that is seen between the word lines of the array (e.g., from 10V to 5V) and thus reduces the maximum field applied across the word line to word line insulation of adjacent word lines of the array/memory cell string 400. It is also noted that in one embodiment the voltage stepping is not applied to the voltage differential between the end word lines of the string 400 and the select gates or their control lines (not shown) that are positioned at the ends of the memory cell string 400, because the insulating oxide is typically thicker there and can more easily withstand higher voltage differentials.

FIG. 5 illustrates another NAND architecture memory embodiment of the present invention that utilizes multiple intermediate voltage steps 508, 510, 514, 516 in for Vpass selection in the adjacent word lines 504 during a self boost programming operation. In FIG. 5, the steps in the applied Vpass 508, 510, 514, 516 for adjacent word lines 504 in the memory cell string 500 are further increased in four voltage steps to additionally spread out the overall voltage drop and further reduce the relative word line to word line voltage differentials. Word lines directly adjacent 504 to the selected word line/memory cell 506 have a Vpass voltage (e.g., 17V) 510 that is equal to standard Vpass 508 plus approximately three quarters the voltage differential between that of the standard Vpass (e.g., 9V) 508 and Vpgm (e.g., 20V) 512. The next further out set of adjacent word lines 504 on either side of the selected word line 506 have a Vpass voltage (e.g., 14V) 514 that is equal to the standard Vpass plus one half the voltage differential between that of the standard Vpass (e.g., 9V) 508 and Vpgm (e.g., 20V) 512. The third set of word lines 504 on either side of the selected word line 506 will have an applied Vpass voltage (e.g., 11V) 516 that is equal to standard Vpass 508 plus one quarter the voltage differential between that of the standard Vpass (e.g., 9V) 508 and Vpgm (e.g., 20V) 512. The fourth and higher sets word lines on either side of the selected word line 506 will have the standard Vpass (e.g., 9V) 508 applied. It is again noted that, for evenly spaced word lines utilizing a uniform insulation, selecting voltage differential steppings in a manner that evenly divide the overall voltage differential between Vpgm 512 and standard Vpass 508 by the number of desired steps (i.e., stepping up by Vpgm−Vpass(std.)/number of steps) will result in the smallest fields being applied across the insulation between the word lines of the string. In embodiments of the present invention that have word lines of the memory cell string with varying physical aspects, including, but not limited to, an interlaced array of alternating wide/thin cross section word lines which have higher/lower word line resistances and/or insulating oxide thickness between adjacent word lines or with the underlying non-volatile memory cells, the Vpass steps should not be evenly stepped, as above, but selected based on the array characteristics in a manner so as to reduce the maximum field differential experienced across the insulation between adjacent word lines. It is further noted that when programming the memory cells near or at the end of the memory cell string 500, that the voltage stepping is typically stopped at the select gate and does not extend past because of the aforementioned typically thicker insulating oxide between the final word line and the select gate.

The memory cells of a NAND string are typically programmed sequentially from the source side (WL0) to the drain side (WL31) of the string. In the worst case scenario, programming the last few cells (cells near WL31) of the string when all or most of the previously programmed cells are in the programmed state can become problematic because of the reduction in channel formation in a self boost programming operation caused by the stored charge on the floating gates. This, in turn, can cause issues with program disturb on the final few memory cells of the string and/or adjacent strings due to the increased voltage drop from poor channel formation. Drain-side self boost (also known as erased area self boost) is one technique that has developed in NAND to help prevent this possibility of disturb by isolating the channel of the memory cell being programmed or inhibited from the remaining un-programmed memory cells of the string. In a drain-side self boost programming operation a word line on the source line coupled side of the memory cell selected for programming and directly adjacent to it is tied to 0V or ground as a blocking cell to isolate the downstream cells of the memory string. Any other word lines on the source side of the selected memory cell that are isolated from the main channel by the blocking cell have Vpass applied to them to generate a local channel and further assist in the prevention of program disturb. "Local self boost" is a related technique to drain-side self boost and further isolates the programmed cell of the string by grounding the directly adjacent word lines on both sides of the selected word line, and ties the remainder of the unselected word lines to Vpass.

FIG. 6 illustrates a further NAND architecture memory 600 embodiment of the present invention that utilizes multiple intermediate voltage steps for Vpass selection in the adjacent word lines during a drain-side self boost programming operation.

In FIG. 6, the blocking cell 624 is selected so that it is not placed directly adjacent to the memory cell selected for programming 622 in the memory cell string 600 and has sufficient intervening word lines to spread out the overall voltage drop as desired and reduce the relative word line to word line voltage differentials. The voltage levels are then stepped 604, 606, 608 in the adjacent word lines from memory cell selected for programming 622 at Vpgm 602 to the blocking cell 624 at the applied blocking gate voltage 610 (such as ground or zero volts). The applied word line voltages 612 on adjacent word lines on the opposite side of the blocking cell 624 can then be, if desired or necessitated by the step size and or planned maximum voltage differential, stepped up from the grounded blocking cell 624 word line voltage back up to Vpass 614. The selected Vpass voltage levels 616 applied to the adjacent word lines on the opposite side of the selected memory cell 622 from the blocking cell 624 are stepped as previously described from Vpgm 602 down to the Vpass voltage level 618. In a local self boost embodiment, a second blocking cell would be positioned on opposite side of the selected memory cell 622 from the first blocking cell 624 and the applied word line voltages stepped from Vpgm 602 to 0V and back up to Vpass 618 in a mirror image of the applied word line voltages applied from the selected memory cell 622 to the first blocking cell 624.

In the example drain-side self boost programming operation of FIG. 6, Vpgm 602 is 20V and the selected word line to word line step voltage is 5V, so that the blocking cell 624 is placed four word lines down stream from the selected word line 622 and the intervening word line voltages selected and stepped from Vpgm=20V 602, to 15V 604, to 10V 606, to 5V 608, to 0V 610 at the blocking cell 624. Once past the blocking cell 624, the applied Vpass word line voltage is then stepped back up to 5V 612, and finally to the standard Vpass=10V for the string 600. On the opposite side of the selected word line 622 from the blocking cell 624, the word line voltage is stepped from Vpgm=20V 602, to 15V 616, to the final standard Vpass unselected word line pass voltage of 10V 618. It is noted that other voltages and step sizes may be used to reduce the field in drain-side self boost and local self boost programming operations.

FIG. 6 details a graph 650 of one embodiment of the applied programming voltages and pass voltages for drain-side self boost programming operations for each possible word line (WL31-WL0) of the memory cell string 600. In the graph 650, the horizontal axis 652 indicates the word line (WL0-WL31) that is selected for programming and will have Vpgm 660 coupled to it. The vertical axis 654 indicates what voltage is applied to each individual word line (WL0-WL31) of the memory cell string 600. The applied voltages are shown stepping by 5V from Vpass=10V up to Vpgm=20V 660, and then from Vpgm 660 to the blocking cell's 0V 662 and then back up to Vpass=10V 664. The control lines of the drain select gate (SGD) 656 and source select gate (SGS) 658 is coupled to Vcc=3V and 0V, respectively.

Tables 1-3 detail various example self boost, drain-side self boost, and local self boost embodiments of the present invention.

TABLE 1

|  | | example1 | example2 |
|---|---|---|---|
| 1) embodiment; Self boost scheme/2 step reduction case | | | |
| WLn + 5 | Vpass2 | 10 V | 8 V |
| WLn + 4 | Vpass2 | 10 V | 8 V |
| WLn + 3 | Vpass2 | 10 V | 8 V |
| WLn + 2 | Vpass2 | 10 V | 8 V |
| WLn + 1 | Vpass1 | 15 V | 12 V |
| WLn | Vpgm | 20 V | 20 V |
| WLn − 1 | Vpass1 | 15 V | 12 V |
| WLn − 2 | Vpass2 | 10 V | 8 V |
| WLn − 3 | Vpass2 | 10 V | 8 V |
| WLn − 4 | Vpass2 | 10 V | 8 V |
| WLn − 5 | Vpass2 | 10 V | 8 V |
| Max WL voltage difference | | 5 V | 8 V |
| 2) embodiment; Self boost scheme/3 step reduction case | | | |
| WLn + 5 | Vpass3 | 10 V | 8 V |
| WLn + 4 | Vpass3 | 10 V | 8 V |
| WLn + 3 | Vpass3 | 10 V | 8 V |
| WLn + 2 | Vpass2 | 12 V | 10 V |
| WLn + 1 | Vpass1 | 15 V | 12 V |
| WLn | Vpgm | 20 V | 20 V |
| WLn − 1 | Vpass1 | 15 V | 12 V |
| WLn − 2 | Vpass2 | 12 V | 10 V |
| WLn − 3 | Vpass3 | 10 V | 8 V |
| WLn − 4 | Vpass3 | 10 V | 8 V |
| WLn − 5 | Vpass3 | 10 V | 8 V |
| Max WL voltage difference | | 5 V | 8 V |
| 3) embodiment; Self boost scheme/4 step reduction case | | | |
| WLn + 5 | Vpass4 | 10 V | 8 V |
| WLn + 4 | Vpass4 | 10 V | 8 V |
| WLn + 3 | Vpass3 | 12 V | 10 V |
| WLn + 2 | Vpass2 | 14 V | 12 V |
| WLn + 1 | Vpass1 | 16 V | 14 V |
| WLn | Vpgm | 20 V | 20 V |
| WLn − 1 | Vpass1 | 16 V | 14 V |
| WLn − 2 | Vpass2 | 14 V | 12 V |
| WLn − 3 | Vpass3 | 12 V | 10 V |
| WLn − 4 | Vpass4 | 10 V | 8 V |
| WLn − 5 | Vpass4 | 10 V | 8 V |
| Max WL voltage difference | | 4 V | 6 V |

TABLE 2

|  |  | example1 | example2 | example3 |
|---|---|---|---|---|
| 1) embodiment; Drain side Self boost/2 step reduction case | | | | |
| WLn + 5 | Vpass2 | 10 V | 8 V | |
| WLn + 4 | Vpass2 | 10 V | 8 V | |
| WLn + 3 | Vpass2 | 10 V | 8 V | |
| WLn + 2 | Vpass2 | 10 V | 8 V | |
| WLn + 1 | Vpass1 | 15 V | 12 V | |
| WLn | Vpgm | 20 V | 20 V | |
| WLn − 1 | Vpass2 | 10 V | 10 V | |
| WLn − 2 | V0 | 0 V | 0 V | |
| WLn − 3 | Vpass2 | 10 V | 8 V | |
| WLn − 4 | Vpass2 | 10 V | 8 V | |
| WLn − 5 | Vpass2 | 10 V | 8 V | |
| Max WL voltage difference | | 10 V | 10 V | |
| 2) embodiment; Drain side Self boost/3 step reduction case | | | | |
| WLn + 5 | Vpass3 | 10 V | 8 V | |
| WLn + 4 | Vpass3 | 10 V | 8 V | |
| WLn + 3 | Vpass3 | 10 V | 8 V | |
| WLn + 2 | Vpass2 | 12 V | 10 V | |
| WLn + 1 | Vpass1 | 15 V | 12 V | |
| WLn | Vpgm | 20 V | 20 V | |
| WLn − 1 | Vpass1 | 13 V | 12 V | |
| WLn − 2 | Vpass3 | 7 V | 8 V | |
| WLn − 3 | V0 | 0 V | 0 V | |
| WLn − 4 | Vpass3 | 10 V | 8 V | |
| WLn − 5 | Vpass3 | 10 V | 8 V | |
| Max WL voltage difference | | 10 V | 8 V | |
| 3) embodiment; Drain side Self boost/4 step reduction case | | | | |
| WLn + 5 | Vpass4 | 10 V | 8 V | 8 V |
| WLn + 4 | Vpass4 | 10 V | 8 V | 8 V |
| WLn + 3 | Vpass3' | 12 V | 10 V | 8 V |
| WLn + 2 | Vpass2' | 14 V | 12 V | 8 V |
| WLn + 1 | Vpass1 | 16 V | 14 V | 14 V |
| WLn | Vpgm | 20 V | 20 V | 20 V |
| WLn − 1 | Vpass1 | 15 V | 14 V | 14 V |
| WLn − 2 | Vpass2 | 10 V | 8 V | 8 V |
| WLn − 3 | Vpass3 | 5 V | 5 V | 5 V |
| WLn − 4 | V0 | 0 V | 0 V | 0 V |
| WLn − 5 | Vpass3 | 5 V | 5 V | 5 V |
| WLn − 6 | Vpass4 | 10 V | 8 V | 8 V |
| Max WL voltage difference | | 5 V | 6 V | 6 V |

TABLE 3

|  |  | example1 | example2 |
|---|---|---|---|
| 1) embodiment; Local Self boost/2 step reduction case | | | |
| WLn + 5 | Vpass2 | 10 V | 8 V |
| WLn + 4 | Vpass2 | 10 V | 8 V |
| WLn + 3 | Vpass2 | 10 V | 8 V |
| WLn + 2 | V0 | 0 V | 0 V |
| WLn + 1 | Vpass1 | 10 V | 8 V |
| WLn | Vpgm | 20 V | 20 V |
| WLn − 1 | Vpass2 | 10 V | 8 V |
| WLn − 2 | V0 | 0 V | 0 V |
| WLn − 3 | Vpass2 | 10 V | 8 V |
| WLn − 4 | Vpass2 | 10 V | 8 V |
| WLn − 5 | Vpass2 | 10 V | 8 V |
| Max WL voltage difference | | 10 V | 12 V |
| 2) embodiment; Local Self boost/3 step reduction case | | | |
| WLn + 5 | Vpass3 | 10 V | 8 V |
| WLn + 4 | Vpass3 | 10 V | 8 V |
| WLn + 3 | V0 | 0 V | 0 V |
| WLn + 2 | Vpass2 | 7 V | 8 V |
| WLn + 1 | Vpass1 | 13 V | 12 V |
| WLn | Vpgm | 20 V | 20 V |
| WLn − 1 | Vpass1 | 13 V | 12 V |
| WLn − 2 | Vpass2 | 7 V | 8 V |
| WLn − 3 | V0 | 0 V | 0 V |
| WLn − 4 | Vpass3 | 10 V | 8 V |
| WLn − 5 | Vpass3 | 10 V | 8 V |
| Max WL voltage difference | | 10 V | 8 V |
| 3) embodiment; Local Self boost/4 step reduction case | | | |
| WLn + 7 | Vpass4 | 10 V | 8 V |
| WLn + 6 | Vpass4 | 10 V | 8 V |
| WLn + 5 | Vpass3 | 5 V | 5 V |
| WLn + 4 | V0 | 0 V | 0 V |
| WLn + 3 | Vpass3 | 5 V | 5 V |
| WLn + 2 | Vpass2 | 10 V | 8 V |
| WLn + 1 | Vpass1 | 15 V | 14 V |
| WLn | Vpgm | 20 V | 20 V |
| WLn − 1 | Vpass1 | 15 V | 14 V |
| WLn − 2 | Vpass2 | 10 V | 8 V |
| WLn − 3 | Vpass3 | 5 V | 5 V |
| WLn − 4 | V0 | 0 V | 0 V |
| WLn − 5 | Vpass3 | 5 V | 5 V |
| WLn − 6 | Vpass4 | 10 V | 8 V |
| WLn − 7 | Vpass4 | 10 V | 8 V |
| Max WL voltage difference | | 5 V | 6 V |

As will be apparent to one skilled in the art, differing Vpass and Vpgm word line voltages and patterns can be set in embodiments of the present invention to compensate for a variety of different word line characteristics, program speeds or program disturb susceptibilities.

Figure 7:
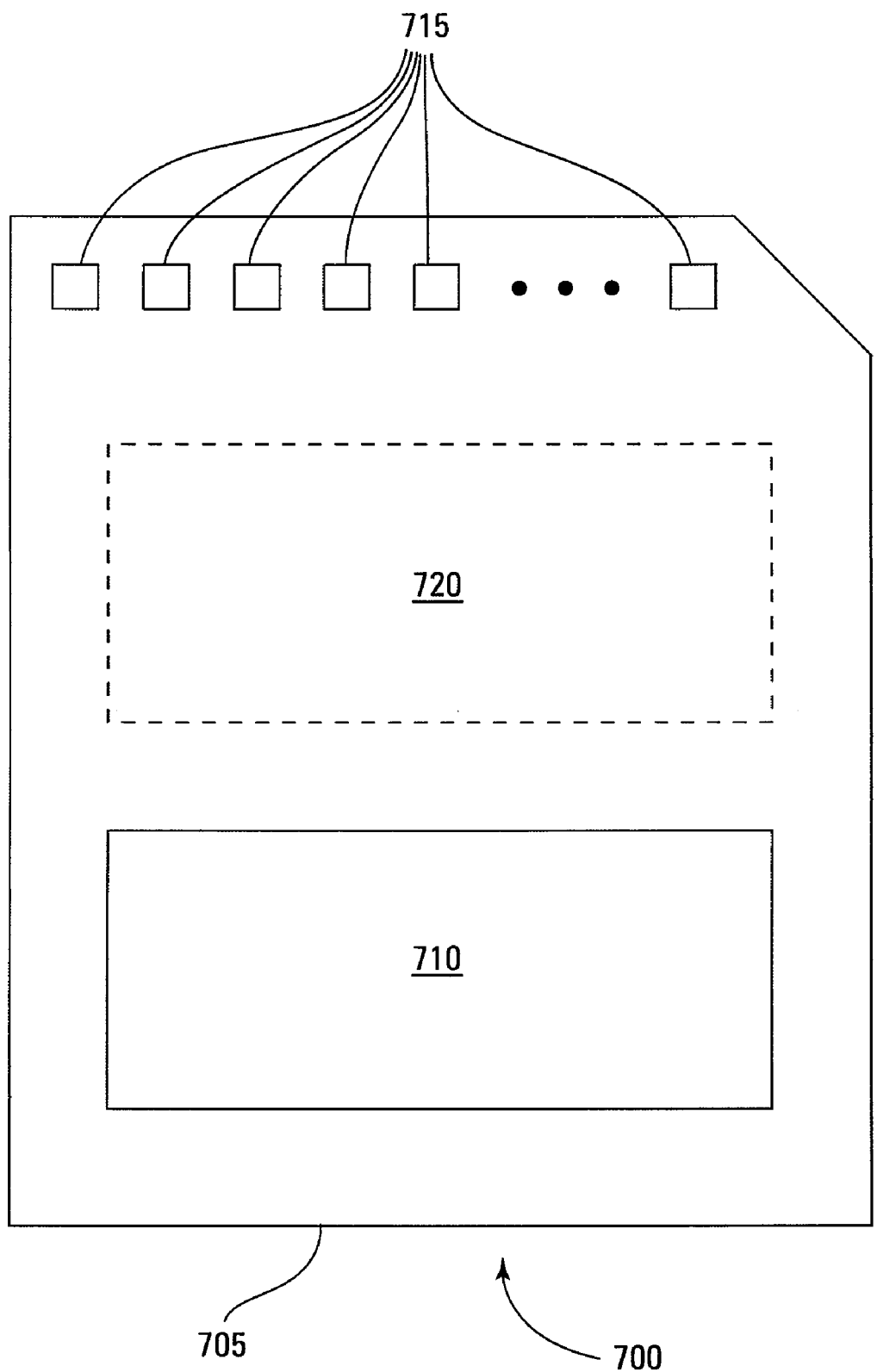
FIG. 7 is a simplified block diagram of a memory module in accordance with an embodiment of the present invention.

FIG. 7 is an illustration of an exemplary memory module 700. Memory module 700 is illustrated as a memory card, although the concepts discussed with reference to memory module 700 are applicable to other types of removable or portable memory, e.g., USB flash drives, and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 is a non-volatile memory including circuits of or adapted to perform elements of methods of the present invention. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720 which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC (application specific integrated circuit). Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

It is noted that other programming operations and voltage levels for non-volatile memory device and array embodiments of the present invention are possible and will be apparent for those skilled in the art with the benefit of this disclosure.

CONCLUSION

A NAND architecture non-volatile memory device and programming process has been described that programs the various cells of strings of non-volatile memory cells by the application of differing word line pass voltages (Vpass) to the unselected word lines adjacent to the selected word line and memory cell being programmed in order to reduce voltage differences between the word lines of the memory cell string or array during a programming cycle. This allows the word line to word line voltage differential to be reduced and thus decreases the likelihood of breakdown or punch through of the insulator materials placed between the adjacent word lines. In one embodiment of the present invention, the differing word line pass voltages (Vpass) are utilized depending on the placement of the memory cell being programmed in the NAND memory cell string. In another embodiment, the word lines coupled to the control gates of non-volatile memory cells of a given NAND memory string will have different voltages placed on them dependent on their position in the memory string and the programming method being utilized.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a selected memory cell of a NAND string of non-volatile memory cells where each memory cell is coupled to a word line, the method comprising:
   applying a programming voltage to a selected word line wherein the selected word line is coupled to the selected memory cell;
   applying a first pass voltage to a first set of word lines, wherein a first word line of the first set of word lines is adjacent to the selected word line and is interposed between the selected word line and a source line connection to the NAND string and a second word line of the first set of word lines is adjacent to the selected word line and is interposed between the selected word line and a bit line connection to the NAND string;
   applying a second pass voltage to a second set of word lines, wherein a first word line of the second set of word lines is adjacent to the first word line of the first set of word lines and is interposed between the first word line of the first set of word lines and the source line connection to the NAND string and a second word line of the second set of word lines is adjacent to the second word line of the first set of word lines and is interposed between the second word line of the first set of word lines and the bit line connection to the NAND string; and
   applying a third pass voltage to a third set of one or more word lines;
   wherein the first pass voltage is less than the programming voltage and where the first pass voltage is greater than the second pass voltage and the third pass voltage.

2. The method of claim 1, further comprising applying a blocking voltage to a word line adjacent to a word line of the second set of one or more word lines.

3. The method of claim 2, wherein applying a blocking voltage further comprises applying a ground potential.

4. The method of claim 1, wherein applying a third pass voltage to the third set of one or more word lines further comprises applying the third pass voltage to the third set of one or more word lines where the third set of word lines are adjacent to the second set of word lines and where the third pass voltage is less than the second pass voltage.

5. The method of claim 4, further comprising applying a blocking voltage to a word line adjacent to a word line of the third set of one or more word lines.

6. The method of claim 4, further comprising applying a fourth pass voltage to a fourth set of one or more word lines where the fourth set of one or more word lines comprises word lines different from the first, second and third sets of word lines.

7. The method of claim 4, further comprising applying a fourth pass voltage to a fourth set of one or more word lines where the fourth set of one or more word lines is adjacent to the third set of word lines.

8. The method of claim 7, wherein applying a fourth pass voltage to a fourth set of one or more word lines further comprises applying a fourth pass voltage where the fourth pass voltage is less than the third pass voltage.

9. The method of claim 1, wherein applying a first pass voltage, applying a second pass voltage and applying a third pass voltage further comprises applying a first pass voltage, applying a second pass voltage and applying a third pass voltage where a difference between the first pass voltage and the second pass voltage is different than a difference between the second pass voltage and the third pass voltage.

10. The method of claim 1, further comprising biasing a single word line located between the first word line of the second set of word lines and the source line connection to the NAND string to a blocking potential where the blocking potential is less than the second pass voltage and the third pass voltage.

11. A method of programming a selected memory cell of a NAND string of non-volatile memory cells where each memory cell is coupled to a word line, the method comprising:

applying a programming voltage to a selected word line wherein the selected word line is coupled to the selected memory cell;

biasing each of two or more first unselected word lines sequentially adjacent to the selected word line and located between the selected word line and a first end of the NAND string with a respective one of a sequence of decreasing pass voltages so that a first unselected word line of the two or more first unselected word lines that is closest to the selected word line is biased with the greatest pass voltage of the sequence of decreasing pass voltages and a first unselected word line of the two or more first unselected word lines that is furthest from the selected word line is biased with the smallest pass voltage of the sequence of decreasing pass voltages; and biasing each of two or more second unselected word lines sequentially adjacent to the selected word line and located between the selected word line and a second end of the NAND string with a respective one of the sequence of decreasing pass voltages so that a second unselected word line of the two or more second unselected word lines that is closest to the selected word line is biased with the greatest pass voltage of the sequence of decreasing pass voltages and a second unselected word line of the two or more second unselected word lines that is furthest from the selected word line is biased with the smallest pass voltage of the sequence of decreasing pass voltages;

wherein the programming voltage is greater than each pass voltage of the sequence of decreasing pass voltages.

12. The method of claim 11, further comprising biasing remaining unselected word lines to a common pass voltage.

13. The method of claim 11, further comprising biasing a single word line to a blocking potential where the single word line is located adjacent to the two or more first unselected word lines.

14. A method of programming a selected memory cell of a NAND string of non-volatile memory cells having a first end of the NAND string coupled to a bit line and a second end of the NAND string coupled to a source line and where each memory cell is coupled to a word line, the method comprising:

applying a programming voltage to a selected word line wherein the selected word line is coupled to the selected memory cell;

biasing a first pair of unselected word lines to first pass voltage that is less than the programming voltage, wherein a first unselected word line of the first pair of unselected word lines is located between the selected word line and the first end of the NAND string and a second unselected word line of the first pair of unselected word lines is located between the selected word line and the second end of the NAND string; and biasing a second pair of unselected word lines to second pass voltage that is less than the first pass voltage, wherein a first unselected word line of the second pair of unselected word lines is located between the first unselected word line of the first pair of unselected word lines and the first end of the NAND string and a second unselected word line of the second pair of unselected word lines is located between the second unselected word line of the first pair of unselected word lines and the second end of the NAND string.

15. The method of claim 14, further comprising biasing remaining unselected word lines to a common pass voltage.

16. The method of claim 14, further comprising applying a blocking potential to a single word line between the second end of the NAND string and the second unselected word line of the second pair of unselected word lines.

17. The method of claim 16, further comprising applying a blocking potential to a single word line between the first end of the NAND string and the first unselected word line of the second pair of unselected word lines.

18. The method of claim 16, wherein applying the blocking potential to the single word line between the second end of the NAND string and the second unselected word line of the second pair of unselected word lines further comprises biasing that single word line to a ground potential.

19. A memory device, comprising:

an array of memory cells arranged in rows and in columns where each memory cell of each row is coupled to a word line, wherein at least one column comprises a string of series coupled memory cells; and control circuitry, wherein the control circuitry is configured to:

apply a programming voltage to a selected word line, wherein the selected word line is coupled to a selected memory cell of the string of series coupled memory cells;

bias each of two or more first unselected word lines sequentially adjacent to the selected word line and located between the selected word line and a first end of the string of series coupled memory cells with a respective one of a sequence of decreasing pass voltages so that a first unselected word line of the two or more first unselected word lines that is closest to the selected word line is biased with the greatest pass voltage of the sequence of decreasing pass voltages and a first unselected word line of the two or more first unselected word line that is furthest from the selected word line is biased with the smallest pass voltage of the sequence of decreasing pass voltages; and bias each of two or more second unselected word lines sequentially adjacent to the selected word line and located between the selected word line and a second end of the string of series coupled memory cells with a respective one of the sequence of decreasing pass voltages so that a second unselected word line of the two or more second unselected word lines that is closest to the selected word line is biased with the greatest pass voltage of the sequence of decreasing pass voltages and a second unselected word line of the two or more second unselected word lines that is furthest from the selected word line is biased with the smallest pass voltage of the sequence of decreasing pass voltages;

wherein the programming voltage is greater than each pass voltage of the sequence of decreasing pass voltages.

20. The memory device of claim 19, wherein the control circuitry is further configured to apply a common pass voltage to remaining unselected word lines.

21. The memory device of claim 19, wherein the control circuitry is further configured to apply a blocking potential to an unselected word line located adjacent to the two or more first unselected word lines.

22. The memory device of claim 21, wherein the blocking potential is a ground potential.

* * * * *

UNITED STATES PATENT AND TRADEMARK OFFICE
CERTIFICATE OF CORRECTION

| | |
|---|---|
| PATENT NO. | : 7,924,619 B2 |
| APPLICATION NO. | : 12/502537 |
| DATED | : April 12, 2011 |
| INVENTOR(S) | : Seiichi Aritome |

It is certified that error appears in the above-identified patent and that said Letters Patent is hereby corrected as shown below:

In column 16, line 38, in claim 19, delete "line that" and insert -- lines that --, therefor.

Signed and Sealed this
Seventh Day of June, 2011

David J. Kappos
*Director of the United States Patent and Trademark Office*